(12) United States Patent
Arao et al.

(10) Patent No.: US 7,772,025 B2
(45) Date of Patent: Aug. 10, 2010

(54) ELECTRONIC DEVICE AND METHOD OF MANUFACTURING THE SAME

(75) Inventors: Osamu Arao, Kariya (JP); Akira Shintai, Chita (JP); Takashige Saitoh, Ama-gun (JP)

(73) Assignee: Denso Corporation, Kariya (JP)

( * ) Notice: Subject to any disclaimer, the term of this patent is extended or adjusted under 35 U.S.C. 154(b) by 96 days.

(21) Appl. No.: 11/902,984

(22) Filed: Sep. 27, 2007

(65) Prior Publication Data

US 2008/0081150 A1 Apr. 3, 2008

(30) Foreign Application Priority Data

Oct. 2, 2006 (JP) .............................. 2006-270716

(51) Int. Cl.
*H01L 21/00* (2006.01)

(52) U.S. Cl. ............................ 438/50; 438/51; 257/415; 257/417; 257/419

(58) Field of Classification Search ................. 257/213, 257/252, 254, 414, 417, 678, 415, 419, 777, 257/783, E23.085; 73/504.15, 514.02, 514.29, 73/514.32; 438/48, 50, 51, 53
See application file for complete search history.

(56) References Cited

U.S. PATENT DOCUMENTS 4,894,698 A * 1/1990 Hijikigawa et al. .......... 257/254

| | | | |
|---|---|---|---|
| 5,614,742 A * | 3/1997 | Gessner et al. ............... 257/254 |
| 6,005,275 A * | 12/1999 | Shinogi et al. ............... 257/417 |
| 6,300,676 B1 * | 10/2001 | Kawai ......................... 257/678 |
| 6,391,742 B2 * | 5/2002 | Kawai ......................... 438/456 |
| 6,936,494 B2 * | 8/2005 | Cheung ........................ 438/55 |
| 7,095,064 B2 * | 8/2006 | Hamamoto .................. 257/254 |
| 7,104,129 B2 * | 9/2006 | Nasiri et al. ............... 73/514.29 |
| 2006/0097331 A1 * | 5/2006 | Hattori et al. ................ 257/414 |

\* cited by examiner

*Primary Examiner*—Leonardo Andújar
*Assistant Examiner*—Jordan Klein
(74) *Attorney, Agent, or Firm*—Posz Law Group, PLC

(57) ABSTRACT

An electronic device includes an electronic element having a detecting part on one surface thereof, a base member, bumps, and an adhesive film. The base member is arranged to face the one surface of the electric element. The bumps are arranged between the electric element and the base member for electrically coupling the electric element and the base member. The adhesive film is attached to the one surface of the electronic element and has an electronic insulating property. In addition, the adhesive film has a hollow part at a portion corresponding to the detecting part in a manner separated from the detecting part. Furthermore, a first pressure in the hollow part is higher than a second pressure outside the hollow part.

1 Claim, 5 Drawing Sheets

ELECTRONIC DEVICE AND METHOD OF MANUFACTURING THE SAME

CROSS REFERENCE TO RELATED APPLICATION

This application is based on Japanese Patent Application No. 2006-270716 filed on Oct. 2, 2006, the content of which is incorporated herein by reference in its entirety.

BACKGROUND OF THE INVENTION

1. Field of the Invention

The present invention relates to an electronic device including an electronic element and a base member which are electrically coupled through bumps. The electronic device can be suitably used for a sensor device for detecting a dynamic quantity such as angular velocity and acceleration, for example.

2. Description of the Related Art

Conventionally, an electronic device used for a sensor device includes a sensor chip having a movable part on one surface thereof, and a circuit chip as a base member. For example, the sensor device includes an angular velocity sensor, an acceleration sensor, and a pressure sensor, each having a sensor chip in which the movable part as a detecting part displaces in accordance with a dynamic quantity such as acceleration, angular velocity, and pressure applied thereto.

For example, US 2006/0097331 A1 (corresponding to JP-2006-189418 A) discloses a sensor device which includes a sensor chip having a movable part on one surface thereof, a circuit chip arranged to face the one surface of the sensor chip, and bumps located between the sensor chip and the circuit chip.

In the sensor device, the sensor chip and the circuit chip are electrically coupled through the bumps. Thereby, a coupling part between the sensor chip and the circuit chip is restricted from deforming due to an impact, compared with a case where the sensor chip and the circuit chip are electrically coupled through wires. Thus, a change of a parasitic capacity at the coupling part is restricted.

Furthermore, this semiconductor device includes an adhesive film having an electric insulation property. The adhesive film is attached to the one surface of the sensor chip while a portion of the adhesive film corresponding to the movable part is separated from the movable part so that a hollow part is provided between the adhesive film and the movable part.

For example, the hollow part is provided by forming a concave part in the adhesive film so that the adhesive film is separated from the movable part. Thereby, the adhesive film can cover the movable part without restricting a movement of the movable part.

In addition, in manufacturing this semiconductor device, the adhesive film having the hollow part is attached to the one surface of the sensor chip, then, the sensor chip faces the circuit chip through the bumps, and the bumps are bonded to the sensor chip and the circuit chip by thermo-compression bonding or ultrasonic bonding, for example.

In this method, the bumps are bonded to the sensor chip and the circuit chip after the adhesive film is attached to the sensor chip. Thus, the hollow part of the adhesive film may be deformed due to a viscosity reduction of the adhesive film by heating, or a vibration during the ultrasonic bonding.

When the hollow part is deformed, the adhesive film may touch the movable part, and may restrict the movement of the movable part. This problem may occur in any other sensor devices which include a sensor chip having a movable part on one surface, and a circuit chip facing the one surface of the sensor chip through bumps so that the sensor chip and the circuit chip are separated from each other by the bumps.

Thus, when an adhesive film is attached to the one surface of the sensor chip while a portion of the adhesive film corresponding to the movable part is separated from the movable part so that a hollow part is provided between the adhesive film and the movable part, the hollow part may be deformed by heating or vibration during bonding of the bumps.

SUMMARY OF THE INVENTION

It is an object of the present invention to provide an electronic device which includes an electronic element having a detecting part on one surface thereof, and a base member electrically coupled with the electric member through bumps. The electric element is provided with an adhesive film having a hollow part for covering the detecting part, and the hollow part can be restricted from deforming after the adhesive film is attached to the electric element.

An electronic device according to a first aspect of the invention includes an electronic element having a detecting part on one surface, a base member, bumps, and an adhesive film. The base member is arranged to face the one surface of the electric element. The bumps are arranged between the electric element and the base member for electrically coupling the electric element and the base member. The adhesive film is attached to the top surface of the electronic element and has an electronic insulating property. In addition, the adhesive film has a hollow part at a portion corresponding to the detecting part in a manner separated from the detecting part. Furthermore, a first pressure in the hollow part is higher than a second pressure outside the hollow part.

In this electronic device, the first pressure is higher than the second pressure, thereby the hollow part can be restricted from deforming after the adhesive film is attached to the electric element.

According to another aspect of the invention, a manufacturing method of an electronic device is provided. The method includes a step of preparing an electronic element having a detecting part on one surface and a base member, a step of attaching a adhesive film having an electronic insulating property on the one surface of the electronic element and forming a hollow part at a portion of the adhesive film corresponding to the detecting part so that the hollow part and the detecting part have clearance therebetween, a step of piling the electronic element and the base member through bumps and the adhesive film in a state where the one surface of the electronic element faces the base member, and a step of electrically coupling the electronic element and the base member by the bumps. Furthermore, in this manufacturing method, a piling of the electronic element and the base member, and a coupling by the bumps are carried out in a state where a first pressure in the hollow part is set to be higher than a second pressure outside the hollow part.

In this manufacturing method, when the piling of the electronic element and the base member, and the coupling by the bumps are carried out, the first pressure is set to be higher than the second pressure. Therefore, the hollow part can be restricted from deforming after the adhesive film is attached to the electric element.

BRIEF DESCRIPTION OF THE DRAWINGS

Additional objects and advantages of the present invention will be more readily apparent from the following detailed description of preferred embodiments when taken together with the accompanying drawings. In the drawings.

DETAILED DESCRIPTION OF THE PREFERRED EMBODIMENTS

First Embodiment

Figure 1:
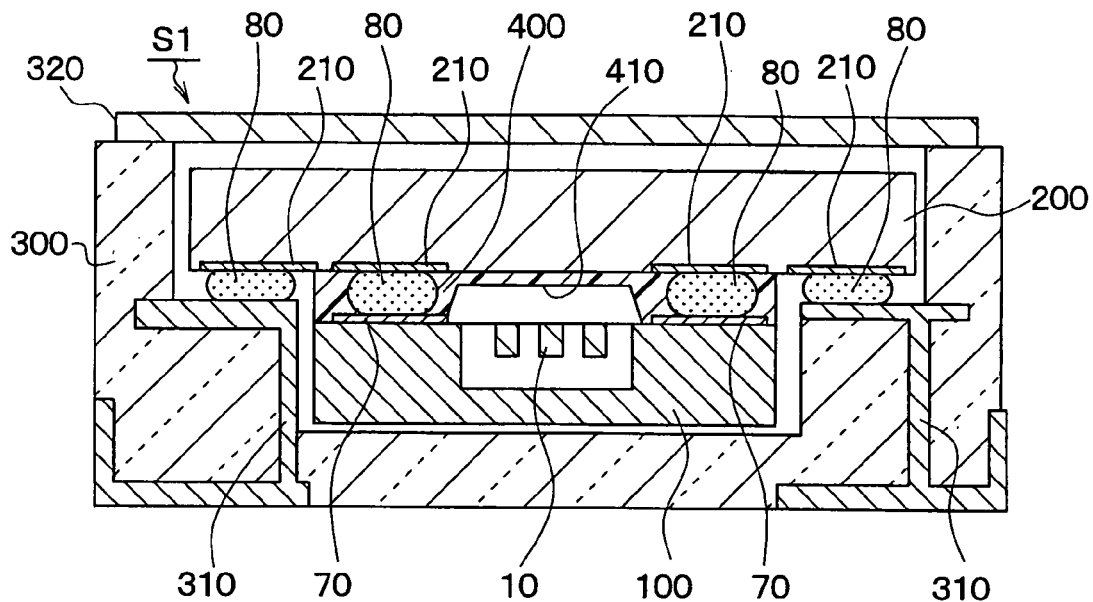
FIG. 1 is a schematic cross-sectional view of an angular velocity sensor according to a first embodiment of the invention.

An electronic device according to a first embodiment of the invention can be used for an angular velocity sensor S1 in FIG. 1, for example. The angular velocity sensor S1 includes a sensor chip 100 as an electronic element, a circuit chip 200 as a base member, and a package 300 for accommodating the sensor chip 100 and the circuit chip 200.

For example, the sensor chip 100 may be an angular velocity sensor chip. The sensor chip 100 includes a substrate such as a semiconductor substrate, and a movable part 10 as a detecting part. The movable part 10 is formed on a top surface of the substrate by micromachining process.

As the substrate for the sensor chip 100, a SOI (silicon-on-insulator) substrate may be used, for example. The SOI substrate includes a first silicon layer, an oxide layer as an insulation layer, and a second silicon layer attached to the first silicon layer through the oxide layer.

The movable part 10 is formed on the top surface of the substrate, e.g., on the second silicon layer in the SOI substrate, by trench etching and release etching. The movable part 10 is coupled with the sensor chip 100 through a beam having a spring property.

The movable part 10 is formed in the sensor chip 100 to vibrate in a first direction when driven. When the movable part 10 receives an angular velocity while vibrating in the first direction, the movable part 10 vibrates in a second direction approximately perpendicular to the first direction due to a Coriolis force. The angular velocity can be detected as a change of capacity, by detecting a displacement of the movable part 10 due to a vibration in the second direction.

On the top surface of sensor chip 100, a plurality of pads 70 is disposed for supplying voltage to the movable part 10 and an electrode (not shown), and for picking up a signal.

Figure 2:
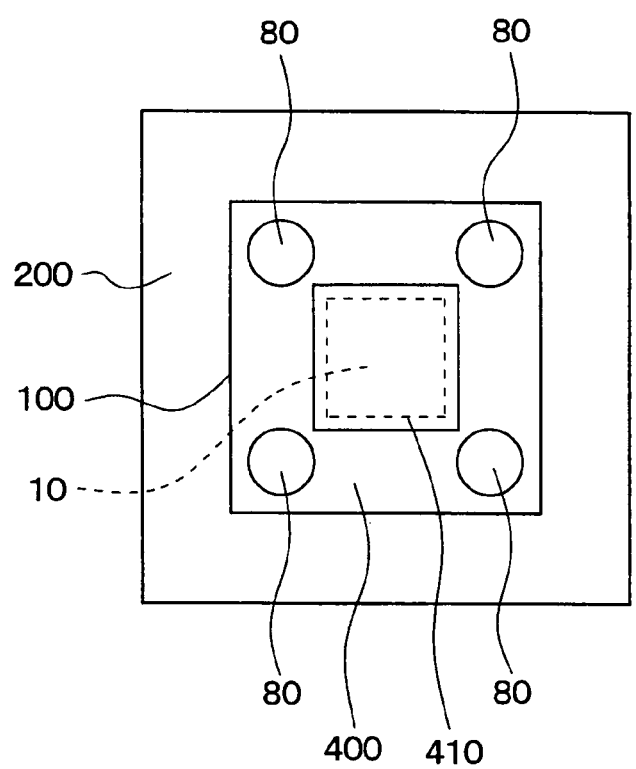
FIG. 2 is a schematic plan view showing a surface structure on a bump side of a circuit chip in the angular velocity sensor according to the first embodiment.

As shown in FIG. 2, the circuit chip 200 has a surface structure on its bump side (i.e., a side of the circuit chip 200 on which bumps 80 are disposed). The movable part 10 is located at an approximately center portion of the top surface of the sensor chip 100, and the pads 70 are disposed at surrounding portions of the top surface of the sensor chip 100. The pads 70 are made of aluminum, for example. The pads 70 are respectively connected to the bumps 80 made of Au or solder, for example.

The bumps 80 may be formed by various methods such as a forming method of a stud bump, a forming method of a solder bump, a screen print using a conductor paste made of Au, and an ink jet print using a nano-paste made of Au.

The sensor chip 100 is electrically coupled with the circuit chip 200 through the bumps 80 so that the top surface of the sensor chip 100, on which the movable part 10 is formed, faces the circuit chip 200.

In the angular velocity sensor S1 in FIG. 1, the pads 70 of the sensor chip 100 are coupled with pads 210 of the circuit chip 200 through the bumps 80. In addition, the top surface of the sensor chip 100 are separated from the circuit chip 200 by heights of the bumps 80, thereby the movable part 10 is separated from the circuit chip 200.

The circuit chip 200 includes a semiconductor chip in which a MOS transistor or a bipolar transistor is formed in a silicon substrate by a well-known semiconductor process, for example. Through the bumps 80, the circuit chip 200 provides the sensor chip 100 with a voltage for driving the movable part 10, and receives an electric signal from the sensor chip 100. In addition, the circuit chip 200 converts and amplifies the electric signal, and outputs the electric signal to an outside.

The circuit chip 200 is electrically and mechanically coupled with the package 300 through the bumps 80. The package 300 includes wires 310 made of a conductive material, and the wires 310 are electrically coupled with the outside.

The package 300 may be made of a ceramic or a resin. In the angular velocity sensor S1, the package 300 is formed with a laminated wiring substrate in which a plurality of ceramic layers made of alumina is laminated, for example. In the laminated wiring substrate, the wires 310 are arranged between each of the ceramic layers, and the wires 310 are conducted each other via through holes.

The pads 210 of the circuit chip 200 and the wires 310 located on a surface of the package 300 are electrically and mechanically coupled through the bumps 80.

The package 300 has a stepped portion therein, and the wires 310 are arranged at the stepped portion to expose. A surrounding portion of the circuit chip 200 which is larger than the sensor chip 100 is held by the stepped portion. Thus, the pads 210 of the circuit chip 200 and the wires 310 of the package 300 are coupled through the bumps 80 at the stepped portion.

In this way, the sensor chip 100 and the outside of the package 300 are electrically coupled through the bumps 80 and the wires 310 so that an output signal from the circuit chip 200 is sent to the outside through the bumps 80 and the wires 310.

The package 300 has an opening part, and a lid 320 is attached to the opening part for sealing an inside of the package 300. The lid 320 may be made of a ceramic, a resin, or a metal, for example. The lid 320 may be attached to the package 300 by various methods such as an adhesion and a welding.

In addition, between the sensor chip 100 and the circuit chip 200, an adhesive film 400 having an electric conductivity is attached on the top surface of the sensor chip 100.

A portion of the adhesive film 400 facing the movable part 10, i.e., covering the movable part 10, is separated from the movable part 10 to provide a hollow part 410. A portion of the adhesive film 400 surrounding the hollow part 410 is attached to the top surface of the sensor chip 100 for sealing a space in the hollow part 410.

For example, the adhesive film 400 may have concave part 410 which has an approximately rectangular shape in a plan surface and is concaved in a direction separating from the movable part 10. A portion of the adhesive film 400 except for the concave part 410 is attached to the sensor chip 100 for sealing the concave part 410, and the sealed concave part 410 becomes the hollow part 410.

In addition, the adhesive film 400 is attached to surround the bumps 80 between the sensor chip 100 and the circuit chip 200, thereby the bumps 80 are sealed by the adhesive film 400.

Furthermore, the hollow part 410 is provided at the portion of the adhesive film 400 facing the movable part 10, thereby the adhesive film 400 is separated from the movable part 10 and the movable part 10 can move without touching the adhesive film 400. Furthermore, the inside of the hollow part is sealed as described above, thereby the movable part 10 is protected from an outside.

In the angular velocity sensor S1, a pressure in the sealed hollow part 410 is higher than that outside the hollow part 410. In other words, a pressure working on an inner surface of the hollow part 410 is higher than a pressure working on an outer surface of the hollow part 410, more specifically, a pressure in the package 300 sealed by the lid 320.

When the pressure in the package 300 is lower than atmospheric pressure, the pressure in the hollow part 400 may be lower than atmospheric pressure as long as the pressure in the hollow part 400 is larger than the pressure in the package 300. However, for a practical use, it is preferred that the pressure in the package 300 is set to be atmospheric pressure, and the pressure in the hollow part 410 is set to be higher than atmospheric pressure. The pressure in the hollow part 410 should not be more than 10 times of atmospheric pressure.

As a material of the adhesive film 400, a film made of a resin having an electrical insulating property can be used. For example, the adhesive film 400 may be made of a resin film such as a NCF (non-conductive film) including polyimide resin, epoxy resin, and silicone resin, and an ACF (anisotropic conductive film). The adhesive film 400 may be a single layer or a multiple layer.

Next, a manufacturing method of the angular velocity sensor device S1 in FIG. 1 will be described with reference to FIGS. 3A-3D. In this case, the pressure outside the hollow part 410 is atmospheric pressure, and the pressure in the hollow part 410 is set to be higher than atmospheric pressure.

In the angular velocity sensor device S1, the adhesive film 400 may include a first layer 401 for providing an attached part to the sensor chip 100, and a second layer 402 for providing the hollow part 410, for example. The first layer 401 and the second layer 402 are attached together.

Figure 3A:
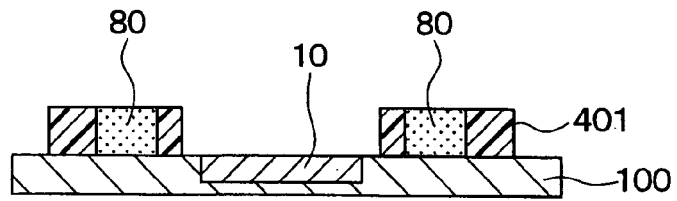
FIGS. 3A-3D are schematic cross-sectional views showing a manufacturing method of the angular velocity sensor according to the first embodiment.
Figure 3B:
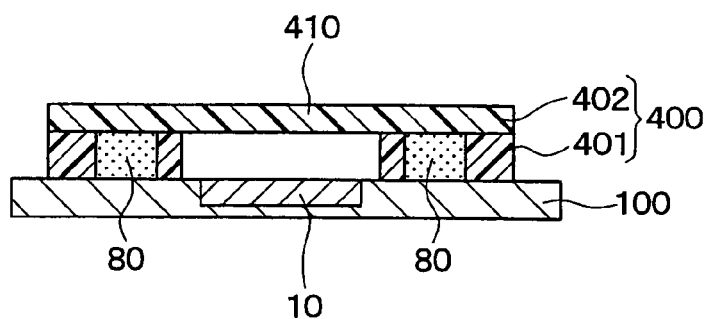
Figure 3C:
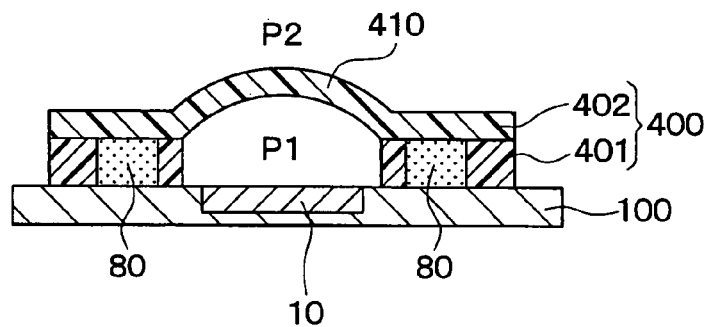
Figure 3D:
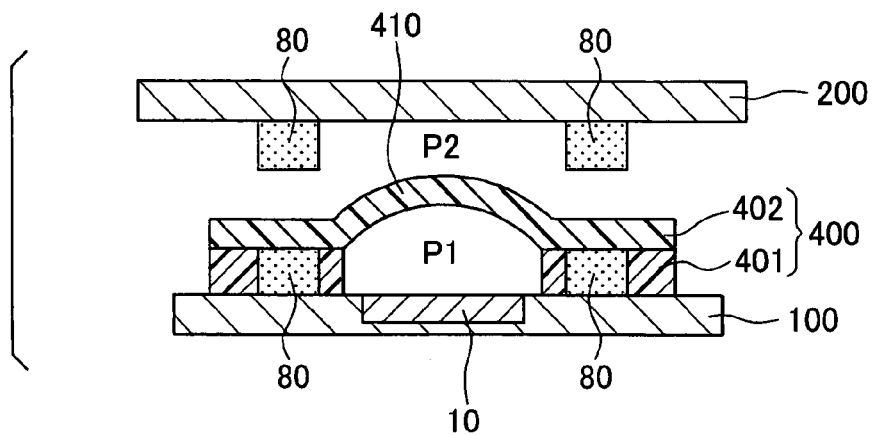

Specifically, the second layer 402 is attached on a surface of the first layer 401 on a side toward the circuit chip 200, as shown in FIG. 3D. The first layer 401 and the second layer 402 may be made of the same material or different materials selected from the above-described materials of the adhesive film 400.

At first, as shown in FIG. 3A, the bumps 80 are disposed on the top surface of the sensor chip 100 by the above-described method, and the first layer 401 is attached at a surrounding portion of the movable part 10 in the top surface of the sensor chip 100 by press bonding, for example.

The first layer 401 is arranged to surround the bumps 80. For example, the first layer 401 may be pressed against the bumps 80 disposed on the top surface of the sensor chip 100, so that the bumps 80 are embedded in the first layer 401. Alternatively, the first layer 401 may have holes in which the bumps 80 are inserted.

As shown in FIG. 3B, after disposing the bumps 80 and the first layer 401 on the top surface of the sensor chip 100, the second layer 402 is attached on the first layer 401 by press bonding, for example. The second layer 402 is positioned to cover the bumps 80 and the movable part 10, and the second layer 402 is separated from the movable part 10 by a thickness of the first layer 401.

The second layer 402 is attached on the first layer 401 under a pressure higher than atmospheric pressure. Specifically, a work attached with the first layer 401 is set in an airtight container, and air is supplied into the airtight container by a compressor for increasing a pressure in the airtight container. Then, the second layer 402 is attached on the first layer 401 under an increased pressure.

The increased pressure corresponds to the pressure in the hollow part 410 in a final product, and is higher than atmospheric pressure, as described above. An attachment of the adhesive film 400 is completed by attaching the second layer 402 on the first layer 401, and the hollow part 410 is provided at the portion of the second layer 402, which faces the movable part 10. The hollow part 410 is concaved by the thickness of the first layer 401.

The hollow part 410 is sealed by attaching the first layer 401 to the sensor chip 100, and the pressure in the hollow part 410 is higher than atmospheric pressure. In a state shown in FIG. 3B, the pressure in the hollow part 410 is almost equal to the pressure outside the hollow part 410 and higher than atmospheric pressure. Thus, the hollow part 410 is approximately flat shape.

Next, the work is taken out from the airtight container, and is set under atmospheric pressure. Thereby, the pressure P2 outside the hollow part 410 becomes atmospheric pressure, and the pressure P1 in the hollow part 410 becomes higher than the pressure P2 outside the hollow part 410 by a pressure difference (P1−P2). Thus, the hollow part 410 is expanded in a direction separating from the movable part 10 due to the pressure difference (P1−P2), compared with a case where the pressure P1 is almost equal to the pressure P2.

In this way, the adhesive film 400 including the two films 401 and 402 is attached on the top surface of the sensor chip 100, and the hollow part 410 is provided at the portion of the adhesive film 400 corresponding to the movable part 10 to have clearance between the hollow part 410 and the movable part 10.

Next, the sensor chip 100 is arranged so that the top surface of the sensor chip 100 faces the circuit chip 200, as shown in FIG. 3D. Then, the sensor chip 100 and the circuit chip 200 are brought close to each other, and the sensor chip 100 is piled on the circuit chip 200 through the bumps 80 and the adhesive film 400, so that the sensor chip 100 and the circuit chip 200 are electrically coupled through the bumps 80. The bumps 80 are disposed on the circuit chip 200 similarly with the above-described method.

In this case, piling of the chips 100 and 200 and bonding of the bumps 80 may be carried out under atmospheric pressure. The pressure P1 in the hollow part 410 is higher than atmospheric pressure, thereby piling of the chips 100 and 200 and bonding of the bumps 80 are carried out in a state where the pressure P1 in the hollow part 410 is set to be higher than the pressure P2 outside the hollow part 410.

In addition, it is preferred that piling of the chips 100 and 200 and bonding of the bumps 80 are carried out in a state where the adhesive film 400 is softened by heating with a heater, for example. Thereby, the bumps 80 on the sensor chip 100 and the bumps 80 on the circuit chip 200 break through the adhesive film 400 and come in contact with each other. Then, contacted bumps 80 are bonded by thermal compression bonding or ultrasonic bonding.

In this way, the sensor chip 100 and the circuit chip 200 are electrically coupled through the bumps 80. In addition, the sensor chip 100 and the circuit chip 200 are mechanically coupled through the adhesive film 400 by using an adhesiveness of the adhesive film 400 and a softening of the adhesive film 400 by heating during the bonding of the bumps 80.

When the sensor chip 100 and the circuit chip 200 are attached to each other, an expanded part of the hollow part 410 shown in FIGS. 3C and 3D is dented by pressing against the circuit chip 200, thereby the hollow part 410 becomes approximately flat shape as shown in FIG. 1. In this case, the adhesive film 400 is formed by attaching the fist film 401 and the second layer 402.

In addition, when the sensor chip 100 is piled on the circuit chip 200, the adhesive film 400 touches the circuit chip 200 from a top of the expanded part of the hollow part 410, thereby a void between the adhesive film 400 and the circuit chip 200 is restricted.

After attaching the sensor chip 100 and the circuit chip 200, attached chips 100 and 200 are coupled with the package 300 through the bumps 80 disposed at portions of the circuit chip 200, which surround the sensor chip 100. Then, the lid 320 is attached to the package 300 for sealing the inside of the package 300. As a result, the angular velocity sensor device S1 in FIG. 1 is formed.

In the angular velocity sensor device S1, the hollow part 410 of the adhesive film 400 can be restricted from deforming because the pressure P1 in the hollow part 410 is higher than the pressure P2 outside hollow part 410. Thus, even when the adhesive film 400 is applied with heat or vibration during the piling of the chips 100 and 200 and bonding of the bumps 80 after adhesive film 400 is attached to the sensor chip 100, the hollow part 410 can be restricted from deforming.

In addition, in the manufacturing method shown in FIGS. 3A-3D, the piling of the chips 100 and 200 and bonding of the bumps 80 are carried out in the state where the pressure P1 in the hollow part 410 is higher than the pressure P2 outside the hollow part 410. Thereby, the hollow part 410 is appropriately formed so that the pressure P1 in the hollow part 410 is higher than the pressure P2 outside the hollow part 410, and the hollow part 410 can be restricted from deforming in processes after the adhesive film 400 is attached to the sensor chip 100.

Furthermore, the adhesive film 400 is attached to the sensor chip 100 under the pressure higher than atmospheric pressure, and the piling of the chips 100 and 200 and bonding of the bumps 80 are carried out under atmospheric pressure. Thus, the pressure P1 in the hollow part 410 is set to be higher than atmospheric pressure, and the pressure P2 outside the hollow part 410 is set to be atmospheric pressure P2. In this manufacturing method, the piling of the chips 100 and 200 and bonding of the bumps 80 can be carried out under atmospheric pressure.

Second Embodiment

According to a second embodiment, the pressure P1 in the hollow part 410 is set to be atmospheric pressure, and the pressure P2 outside the hollow part 410 is set to be lower than atmospheric pressure, as described below.

Figure 4A:
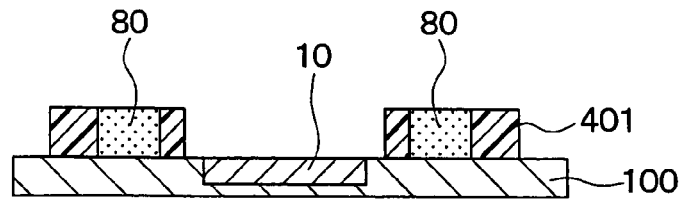
FIGS. 4A-4C are schematic cross-sectional views showing a manufacturing method of an angular velocity sensor according to a second embodiment of the invention.

At first, in a process shown in FIG. 4A, the bumps 80 are disposed on the top surface of the sensor chip 100, and the first layer 401 of the adhesive film 400 is attached at the surround portion of the movable part 10 in the top surface of the sensor chip 100, similarly with a process shown in FIG. 3A.

Figure 4B:
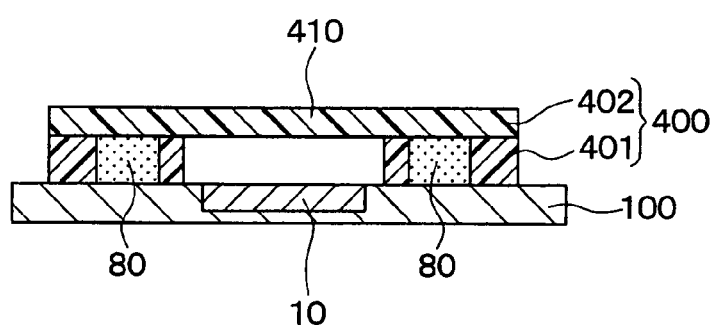

Next, as shown in FIG. 4B, the second layer 402 is piled on the first layer 401, and the films 401 and 402 are bonded by press bonding under atmospheric pressure. Thereby, the attachment of the adhesive film 400 is completed and the hollow part 410 is provided at the portion of the second layer 402, which faces the movable part 10. In this state, the pressures in and outside the hollow part 410 are atmospheric pressure, thereby the hollow part 410 has approximately flat shape.

In this way, the adhesive film 400 formed by attaching the first layer 401 and the second layer 402 and having the hollow part 410 is attached on the top surface of the sensor chip 100.

Figure 4C:
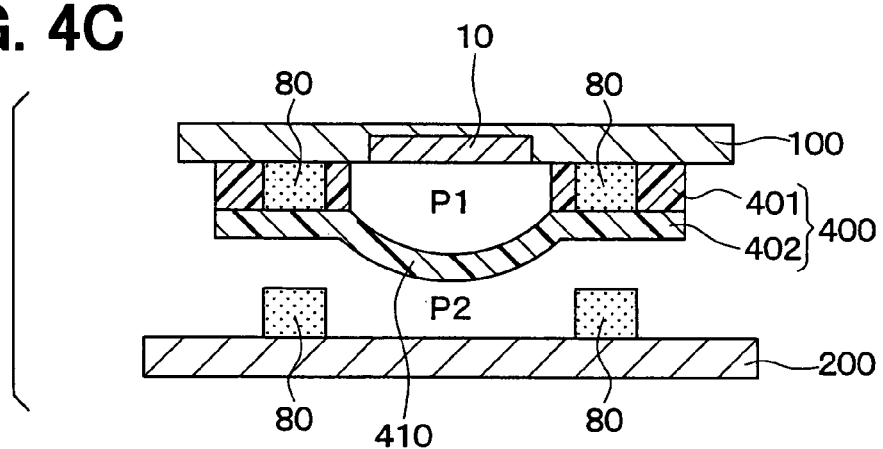

Next, the piling of the chips 100 and 200 and the bonding of the bumps 80 are carried out. As shown in FIG. 4C, the sensor chip 100 is arranged so that the top surface of the sensor chip 100 faces the circuit chip 200. In this manufacturing method, the work is set under the pressure P2 lower than atmospheric pressure.

Specifically, the sensor chip 100 attached with the adhesive film 400 and the circuit chip 200 are set in an airtight container (not shown) with an apparatus required for the bump bonding. Then, air in the airtight container is sucked by a vacuum pump for decreasing a pressure in the airtight container.

In a state under a decreased pressure, the pressure P2 outside the hollow part 410 becomes lower than atmospheric pressure while the pressure P1 in the hollow part 410 remain atmospheric pressure. Thereby, the hollow part 410 expands in the direction separating from the movable part 10 due to the pressure difference (P1−P2), compared with the case where the pressure P1 is almost equal to the pressure P2. The decreased pressure, i.e., the pressure P2 outside the hollow part 410 is not limited but may be lower than about 0.9999 times as high as atmospheric pressure. An under limit of the decreased pressure may be an approximately vacuum state reachable by using a normal vacuum pump.

Under the decreased pressure, the sensor chip 100 is faced the circuit chip 200, and the piling of the chips 100 and 200 and bonding of the bumps 80 are carried out. Thus, also in this manufacturing method, the piling and the bonding are carried out in the state where the pressure P1 in the hollow part 410 is higher than the pressure P2 outside the hollow part 410.

In this way, the sensor chip 100 and the circuit chip 200 are electrically coupled through the bumps 80 and mechanically coupled through the adhesive film 400. Then, the sensor chip 100 and the circuit chip 200 are attached to the package 300 and the package 300 is sealed as described above, so that the angular velocity sensor device is formed.

The angular velocity sensor manufactured by the method according to the second embodiment has a similar shape with that manufactured by the method according to the first embodiment. However, in the second embodiment, the pressure in the hollow part 410 is atmospheric pressure. In other words, the pressure in the hollow part 410 is not required to be higher than the pressure outside the hollow part 410 in the final product, and may almost equal to the pressure outside the hollow part 410.

As described above, in the manufacturing method according to the second embodiment, the attachment of the adhesive film 400 is carried out under atmospheric pressure, and the piling of the chips 100 and 200 and the bonding of the bumps 80 are carried out under the decreased pressure lower than atmospheric pressure.

Thus, when the piling of the chips 100 and 200 and the bonding of the bumps 80 are carried out, the pressure P1 in the hollow part 410 becomes atmospheric pressure, and the pressure P2 outside the hollow part 410 becomes the decreased pressured lower than atmospheric pressure. Therefore, the hollow part 410 can be restricted from deforming in the processes after the attachment of the adhesive film 400.

Furthermore, in the manufacturing method according to the second embodiment, the attachment of the adhesive film 400 can be carried out under atmospheric pressure.

Third Embodiment

According to a third embodiment, only the pressure P2 applied to an outer surface of the hollow part 410 is partially decreased while the pressure applied to other part of the work remains atmospheric pressure.

In this manufacturing method, processes to the attachment of the adhesive film 400 are carried out similarly with the processes shown in FIGS. 4A and 4B. Then, the sensor chip 100 is piled on the circuit chip 200, which has a hole 220 provided at a portion facing the hollow part 410, as shown in FIG. 5.

The hole 220 in the circuit chip 200 is easily formed by a normal boring process such as press working. When the piling of the chips 100 and 200, and the bonding of the bumps 80 are carried out, a suction pump (not shown) is provided at an outside of the circuit chip 200 for sucking air surrounding the hollow part 410 through the hole 220.

Thus, air surrounding the hollow part 410 flows to an outside of the circuit chip 200 through the hole 200, thereby the pressure P2 in the vicinity of the outer surface of the hollow part 410 becomes lower than atmospheric pressure.

Figure 5:
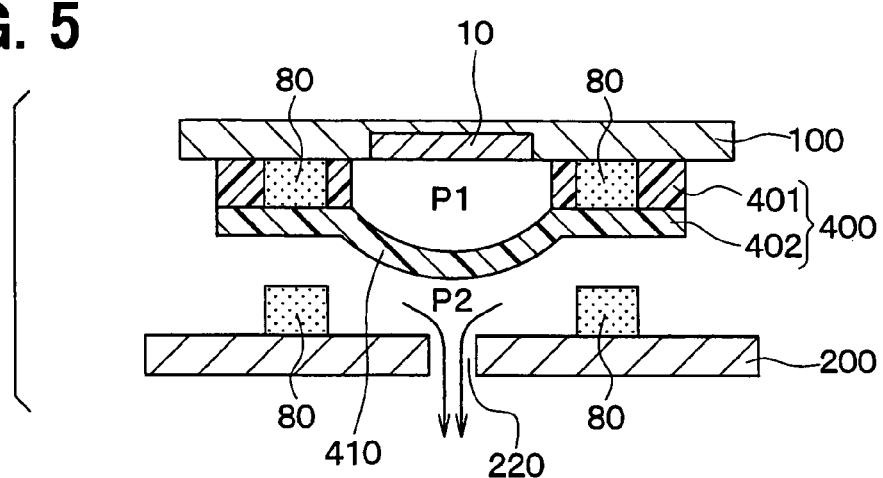
FIG. 5 is a schematic cross-sectional view showing a manufacturing method of an angular velocity sensor according to a third embodiment of the invention.

In this way, also in the manufacturing method shown in FIG. 5, the piling of the chips 100 and 200 and bonding of the bumps 80 are carried out in the state where the pressure P1 in the hollow part 410 is higher than the pressure P2 outside the hollow part 410. Therefore, the hollow part 410 can be restricted from deforming in the processes after the attachment of the adhesive film 400.

Fourth Embodiment

Figure 6A:
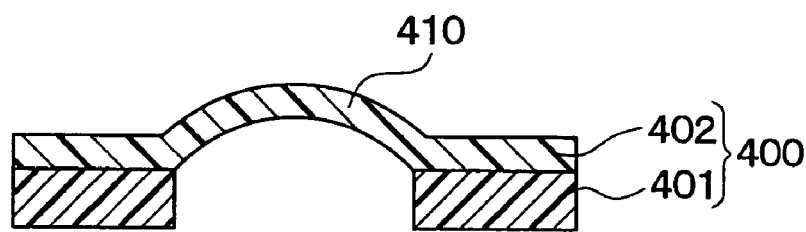
FIGS. 6A-6C are schematic cross-sectional views showing a manufacturing method of an angular velocity sensor according to a fourth embodiment of the invention.
Figure 6B:
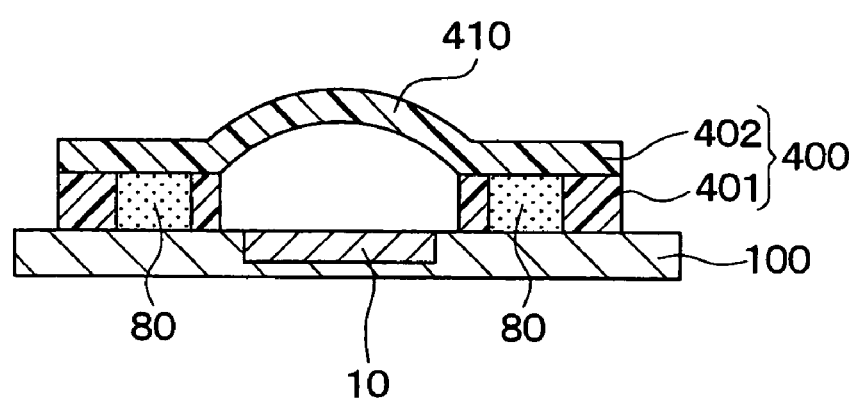

In a fourth embodiment, the adhesive film 400 is expanded before attached to the sensor chip 100. At first, the first layer 401 and the second layer 402 are bonded by a press bonding, and the hollow part 410 of the second layer 402 is expanded in an opposite direction to the first layer 401 by press working, as shown in FIG. 6A.

Figure 6C:
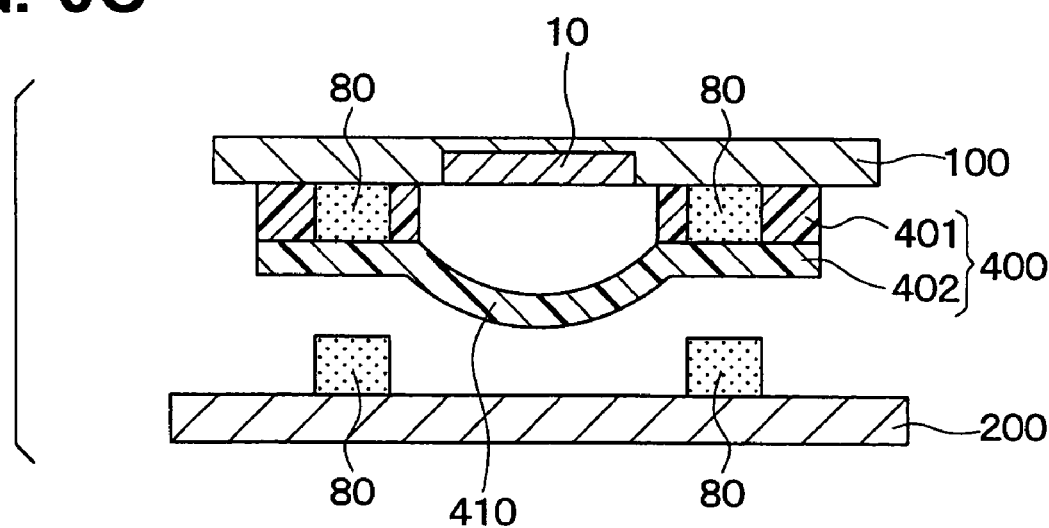

Then, the adhesive film 400 is attached to the top surface of the sensor chip 100 by press bonding. In addition, the sensor chip 100 is faced the circuit chip 200, and the piling of the chips 100 and 200 and the bonding of the bumps 80 are carried out, as shown in FIG. 6C.

The attachment of the adhesive film 400 and the later processes may be carried out by any one of the methods described in the first to third embodiments. Also in this embodiment, the piling of the chips 100 and 200 and the bonding of the bumps 80 are carried out in the state where the pressure P1 in the hollow part 410 is set to be higher than the pressure P2 outside the hollow part.

In the manufacturing method according to the fourth embodiment, the hollow part 410 is separated from the movable part 10 in advance, thereby coupled with the an effect by the pressure difference (P1−P2) in the processes of the piling of the chips 100 and 200 and the bonding of the bumps 80, the hollow part 410 can be restricted from deforming. The process of expanding the hollow part 410 of the adhesive film 400 before attached to the sensor chip 100 can be applied to the first to third embodiments.

Fifth Embodiment

Figure 7:
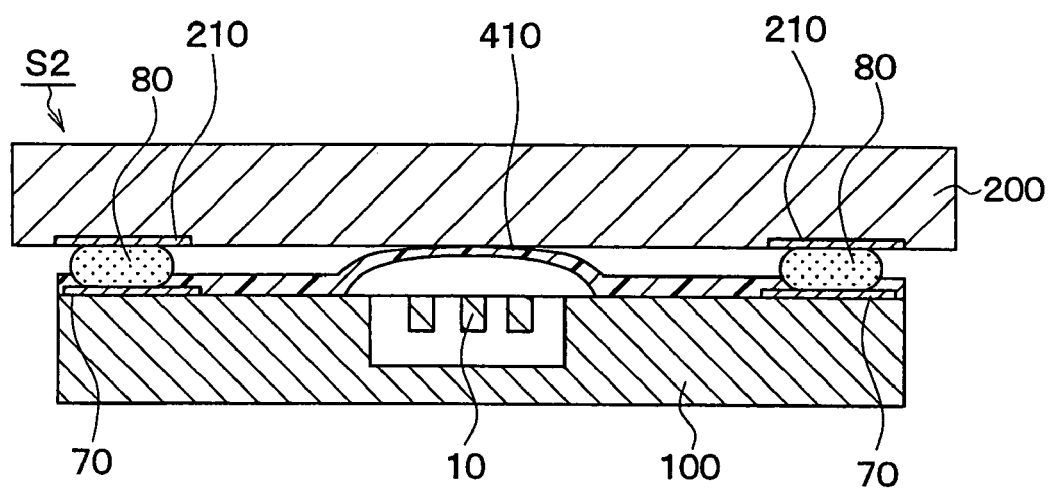
FIG. 7 is a schematic cross-sectional view of an angular velocity sensor according to a fifth embodiment of the invention.

In a fifth embodiment, the sensor chip 100 and the circuit chip 200 are attached to have a clearance therebetween, so that the expanded part of the hollow part 410 can remain, as shown in FIG. 7. In an angular velocity sensor S2 in FIG. 7, the hollow part 410 has a dome shape expanding in the direction separated from the movable part 10.

Sixth Embodiment

Figure 8:
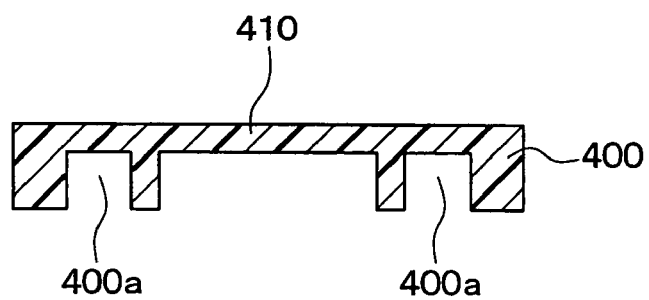
FIG. 8 is a schematic cross-sectional view of an adhesive film according to a sixth embodiment of the invention.

In a sixth embodiment, the adhesive film 400 is formed by one film which provides both the attached part to the sensor chip 100 and the hollow part 410. For example, the adhesive film 400 may be formed by one film having the hollow part 410 formed by press working or etching, as shown in FIG. 8.

In addition, the adhesive film 400 has holes 400a at the attached part to the sensor chip 100 so that the bumps 80 disposed on the sensor chip 100 are inserted to the holes 400a. However, the holes 400a may not be required because the bumps 80 can be embedded in the adhesive film 400, as described above.

The attachment of the adhesive film 400 and the later processes can be carried out by any one of the methods described in the first to fourth embodiments. In addition, the sensor chip 100 may be attached to the circuit chip 200 to have a clearance therebetween, similarly with those in the fifth embodiment. Even when the adhesive film 400 shown in FIG. 8 is used, the effects similar with those of the above-described embodiments can be obtained.

Other Embodiments

In the above-described embodiments, when the pressure P1 in the hollow part 410 is set to be higher than the pressure P2 outside the hollow part 410, the pressure difference (P1−P2) is set so that the hollow part 410 can be expanded in the direction separating from the movable part 10, compared with the case where the pressure P1 is almost equal to the pressure P2.

Here, the pressure difference (P1−P2) may be set in a range such that the effect to keep the shape of the hollow part 410 can be obtained, and is not required to expand the hollow part 410.

Alternatively, in the manufacturing method described in the first embodiment, the piling of the chips 100 and 200 and the bonding of the bumps 80 may be curried our under a pressure lower than atmospheric pressure by combining with the manufacturing method using the decreased pressure, as described in the second embodiment.

Thereby, the pressure P1 in the hollow part 410 is set to be higher than atmospheric pressure, and the pressure P2 outside the hollow part 410 is set to be lower than atmospheric pressure. Also in this case, the pressure P1 in the hollow part 410 is higher than the pressure P2 outside the hollow part 410, thereby the hollow part 410 can be restricted from deforming.

In the above-described first to sixth embodiments, the pressure P1 in the hollow part 410 and the pressure P2 outside the hollow part 410 during the piling of the chips 100 and 200 and the bonding of the bumps 80 are set to be the pressure during the attachment of the adhesive film 400 and the pressure during the piling of the chips 100 and 200 and the bonding of the bumps 80. However, the pressures P1 and P2 are not limited to them.

Alternatively, the sensor chip 100 as the electric element is not limited to the angular velocity sensor chip but may be an acceleration sensor chip. In a case where the acceleration sensor chip is used as the electric element, a movable part as the detecting part displaces in one direction when acceleration is applied, and the acceleration is obtained by detecting a displacement of the movable part as a change of capacity.

The movable part as the detecting part is not limited to a beam structure in the angular velocity sensor or the acceleration sensor but may be a diaphragm in a pressure sensor. Alternatively, the electric element is not limited to the above-described sensor chip but may be any elements having the detecting part on one surface, e.g., a BGA (ball grid array) or a flip chip.

Alternatively, the detecting part in the electric element may be a humidity detecting part in a humidity sensor or any circuit part in which a circuit is formed, without being limited to the movable part displacing in accordance with a dynamic quantity such as angular velocity, acceleration, and pressure. In other words, the detecting part may be a portion in a surface of the electric element, from which the adhesive film 400 is required to be separated.

Alternatively, as the base member, various circuit boards, wiring boards, and lead flames are used without being limited to the above-described circuit chip.

Such changes and modifications are to be understood as being within the scope of the present invention as defined by the appended claims.

What is claimed is:

1. A manufacturing method of an electronic device, comprising:
   preparing an electronic element having a detecting part on one surface thereof and a base member;
   attaching an adhesive film having an electronic insulating property on the one surface of the electronic element and forming a hollow part at a portion of the adhesive film corresponding to the detecting part so that the hollow part and the detecting part have clearance therebetween;
   piling the electronic element and the base member through bumps and the adhesive film in a state where the one surface of the electronic element faces the base member; and
   electrically coupling the electronic element and the base member by the bumps, wherein:
   a piling of the electronic element and the base member, and a coupling by the bumps are carried out in a state where a first pressure in the hollow part is set to be at atmospheric pressure and a second pressure outside the hollow part is set to be lower than the atmospheric pressure; and
   expanding the adhesive film in a direction separating from the detecting part before attaching the adhesive film on the one surface of the electronic element.

* * * * *